US011346924B2

United States Patent
Onal et al.

(10) Patent No.: US 11,346,924 B2
(45) Date of Patent: May 31, 2022

(54) SIPM WITH CELLS OF DIFFERENT SIZES

(71) Applicant: Waymo LLC, Mountain View, CA (US)

(72) Inventors: Caner Onal, Mountain View, CA (US); Nirav Dharia, Mountain View, CA (US)

(73) Assignee: Waymo LLC, Mountain View, CA (US)

(*) Notice: Subject to any disclaimer, the term of this patent is extended or adjusted under 35 U.S.C. 154(b) by 363 days.

(21) Appl. No.: 16/707,127

(22) Filed: Dec. 9, 2019

(65) Prior Publication Data

US 2021/0173052 A1 Jun. 10, 2021

(51) Int. Cl.
*G01S 17/88* (2006.01)
*G01S 7/4863* (2020.01)
(Continued)

(52) U.S. Cl.
CPC ........ *G01S 7/4863* (2013.01); *H01L 27/1446* (2013.01); *H01L 31/02327* (2013.01); *H01L 31/107* (2013.01)

(58) Field of Classification Search
CPC ...... G01S 7/4861; G01S 7/4868; G01S 17/88; G01S 17/89; G01S 17/93;
(Continued)

(56) References Cited

U.S. PATENT DOCUMENTS 5,218,211 A * 6/1993 Cresswell .............. G01N 21/94
250/559.04
7,759,650 B2 7/2010 Heringa et al.
(Continued)

FOREIGN PATENT DOCUMENTS

GB 2509545 7/2014
WO 2008/107718 9/2008
(Continued)

OTHER PUBLICATIONS

Grabas et al., "Development of large area, pico-second resolution photo-detectors and associated readout electronics," 2011 2nd International Conference on Advancements in Nuclear Instrumentation, Measurement Methods and their Applications, Jun. 2011.
(Continued)

*Primary Examiner* — Que Tan Le
(74) *Attorney, Agent, or Firm* — McDonnell Boehnen Hulbert & Berghoff LLP

(57) ABSTRACT

The present disclosure relates to devices, light detection and ranging (lidar) systems, and vehicles involving solid-state, single photon detectors. An example device includes a substrate defining a primary plane and a plurality of photodetector cells disposed along the primary plane. The plurality of photodetector cells includes at least one large-area cell and at least one small-area cell. The large-area cell has a first area and the small-area cell has a second area and the first area is greater than the second area. The device also includes read out circuitry coupled to the plurality of photodetector cells. The read out circuitry is configured to provide an output signal based on incident light detected by the plurality of photodetector cells.

20 Claims, 12 Drawing Sheets

(51) Int. Cl.
*H01L 31/0232* (2014.01)
*H01L 31/107* (2006.01)
*H01L 27/144* (2006.01)

(58) Field of Classification Search
CPC ......... H01L 27/14601; H01L 27/14603; H01L 27/14605; H01L 27/14607; H01L 27/1463; H01L 31/0232; H01L 31/107
USPC .......................................... 250/214.1, 214 R
See application file for complete search history.

(56) References Cited

U.S. PATENT DOCUMENTS

| | | | |
|---|---|---|---|
| 7,821,553 | B2 | 10/2010 | Ellis-Monaghan et al. |
| 8,410,449 | B2 | 4/2013 | Thon et al. |
| 8,660,236 | B2 | 2/2014 | Carmi et al. |
| 8,723,100 | B2 | 5/2014 | Sanfilippo et al. |
| 8,754,378 | B2 | 6/2014 | Prescher et al. |
| 8,766,339 | B2 | 7/2014 | Teshima et al. |
| 9,087,755 | B2 | 7/2015 | Frach |
| 9,372,286 | B2 | 6/2016 | Li et al. |
| 10,295,669 | B2 | 5/2019 | Deane |
| 2004/0245592 | A1 | 12/2004 | Harmon et al. |
| 2006/0175529 | A1 | 8/2006 | Harmon et al. |
| 2006/0231771 | A1 | 9/2006 | Lee et al. |
| 2010/0200763 | A1 | 8/2010 | Thon et al. |
| 2014/0167200 | A1 | 6/2014 | Sun et al. |
| 2015/0054997 | A1 | 2/2015 | Hynecek |
| 2017/0263793 | A1 | 9/2017 | Ueno et al. |
| 2018/0195900 | A1 | 7/2018 | Delic |
| 2019/0099138 | A1 | 4/2019 | Kim |

FOREIGN PATENT DOCUMENTS

| | | |
|---|---|---|
| WO | 2010/080048 | 7/2010 |
| WO | 2019/106429 | 6/2019 |

OTHER PUBLICATIONS

Sacco et al., "A new position-sensitive silicon photomultiplier with submillimeter spatial resolution for photon-cluster identification," Sensors, IEEE, 2013.

Vinayaka et al., "Monolithic 8×8 SiPM with 4-bit Current-Mode Flash ADC with Tunable Dynamic Range," Tech Session 2: VLSI Circuits and Power Aware Design, GLSVLSI '19, May 9-11, 2019, Tysons Comer, VA, USA, pp. 57-62.

International Searching Authority, International Search Report and Written Opinion dated Mar. 2, 2021, issued in connection with International Patent Application No. PCT/US2020/060607 filed on Nov. 13, 2020, 11 pages.

* cited by examiner

SIPM WITH CELLS OF DIFFERENT SIZES

BACKGROUND

Solid-state, single photon detectors such as silicon photomultiplier devices (e.g., SiPMs) may include an array of about 2500 single-photon detectors or cells. In such scenarios, each cell could include a single-photon avalanche diode (SPAD) operating in Geiger mode. In some embodiments, the plurality of cells can be coupled in parallel (or in another type of coupling arrangement) to provide a desired dynamic range of the photodetector (e.g., the ability to detect up to $10^7$ photons before coming saturated).

However, there exists a need for solid-state, single photon detectors with the capability to sense light over even wider dynamic ranges.

SUMMARY

Example embodiments relate to methods, devices, and systems for detecting light with single-photon resolution over a wide dynamic range.

In a first aspect, a device is provided. The device includes a substrate defining a primary plane and a plurality of photodetector cells disposed along the primary plane. The plurality of photodetector cells includes at least one large-area cell and at least one small-area cell. The large-area cell has a first area and the small-area cell has a second area. The first area is greater than the second area. The device also includes read out circuitry coupled to the plurality of photodetector cells. The read out circuitry is configured to provide an output signal based on incident light detected by the plurality of photodetector cells.

In a second aspect, a light detection and ranging (lidar) system is provided. The lidar system includes at least one light-emitter device and a receiver subsystem. The receiver subsystem includes a substrate defining a primary plane and a plurality of photodetector cells disposed along the primary plane. The plurality of photodetector cells includes at least one large-area cell and at least one small-area cell. The large-area cell has a first area and the small-area cell has a second area. The first area is greater than the second area. The lidar system also include read out circuitry coupled to the plurality of photodetector cells. The read out circuitry is configured to provide an output signal based on incident light detected by the plurality of photodetector cells.

In a third aspect, a vehicle is provided. The vehicle includes at least one light detection and ranging (lidar) system. The lidar system includes at least one light-emitter device and a receiver subsystem. The receiver subsystem includes a substrate defining a primary plane. The lidar system also includes a plurality of photodetector cells disposed along the primary plane. The plurality of photodetector cells includes at least one large-area cell and at least one small-area cell. The large-area cell has a first area and the small-area cell has a second area. The first area is greater than the second area. The lidar system also includes read out circuitry coupled to the plurality of photodetector cells. The read out circuitry is configured to provide an output signal based on incident light detected by the plurality of photodetector cells.

Other aspects, embodiments, and implementations will become apparent to those of ordinary skill in the art by reading the following detailed description, with reference where appropriate to the accompanying drawings.

DETAILED DESCRIPTION

Figure 1:
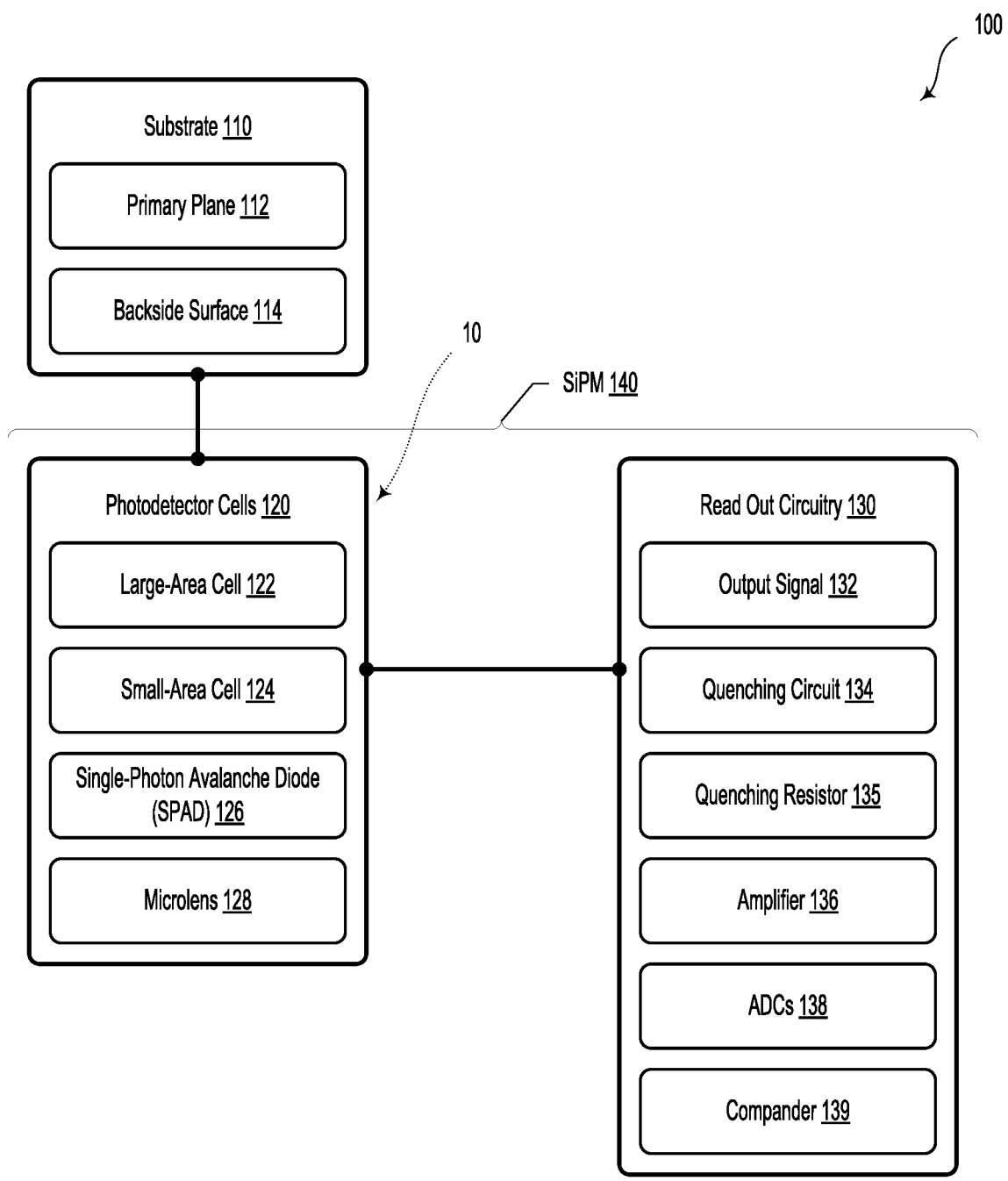
FIG. 1 illustrates a device, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

A SiPM includes an array of single photon avalanche diodes (SPADs) that are electrically connected in parallel. A SPAD is a single-photon sensitive device that is designed to operate in Geiger mode. In some operating scenarios (e.g., low-light operation), it may be desirable for the response of the SiPM to be substantially linear when detecting a relatively small number of photons (e.g., on the order of 10 photons). To provide the desired response and dynamic range, example embodiments may include one or more "large-area" cells disposed near the center of the photodetector that are relatively larger (e.g., having an edge-length of approximately 30 microns) and "small-area" cells near the edges of the photodetector that are relatively smaller (e.g., having an edge-length of approximately 10 microns). In some embodiments, the "large-area" cells could provide a higher sensitivity in comparison to a similar active area of "small-area" cells. Meanwhile, the "small-area" cells may help provide improved dynamic range as compared to the "large-area" cells because they are more resistant to "blooming" and/or may provide faster cell recovery times.

In some embodiments, the "large-area" cells could be configured to provide respective outputs to a first 12-bit analog-to-digital converter (ADC) and the "small-area" cells could be configured to provide respective outputs to a second 12-bit ADC. The digital outputs from the first and the second 12-bit ADCs could be companded (expanded and/or compressed) or otherwise processed so as to form a high dynamic range (HDR) (e.g., 16-bit signal) representation of the light received by the photodetector.

Alternatively or additionally, some embodiments may include a microlens over each cell or group of cells. In some embodiments, the position of large-area cells and small-area cells could be selected based on a predetermined beam intensity profile (e.g., flat-top, Gaussian, or super-Gaussian profile) of incident light.

In example embodiments, an arrangement of "large-area" cells and "small-area" cells could be correspond to a position of one or more apertures in a pinhole array. For example, the "large-area" cells could be positioned substantially about centers of the respective apertures of the pinhole array. In some embodiments, small area cells (with lower PDE, higher dynamic range) could be mixed with large area cells. In some embodiments, designs with mixed area photodetectors may provide the design latitude to trade off some small PDE for higher sensitivity and improved overall dynamic range.

II. Example Devices

FIG. 1 illustrates a device 100, according to an example embodiment. The device 100 includes a substrate 110 defining a primary plane 112. The primary plane 112 could be a plane along a surface of the substrate 110 (e.g., a frontside surface), or the primary plane 112 could be plane within the substrate 110. In some embodiments, the substrate 110 could include a semiconductor substrate material such as a silicon substrate (e.g., a silicon wafer), a gallium arsenide substrate (e.g., a GaAs wafer), or the like. In some embodiments, the substrate 110 could include a silicon-on-insulator (SOI) material or printed circuit board (PCB). Alternatively, the substrate 110 could be formed from a variety of other solid and/or flexible materials, each of which is contemplated in the present disclosure.

In some embodiments, the substrate 110 could be approximately 200 microns thick. For instance, the substrate 110 could have a thickness of between 100 to 500 microns. However, other thicknesses are possible and contemplated.

The device 100 also includes a plurality of photodetector cells 120 disposed along the primary plane 112. For example, the photodetector cells 120 could be disposed along the primary plane 112 according to at least one of a square array or a hexagonal array. The plurality of photodetector cells 120 includes at least one large-area cell 122 and at least one small-area cell 124. The large-area cell 122 has a first area and the small-area cell 124 has a second area. In such scenarios, the first area is greater than the second area.

In example embodiments, the photodetector cells 120 could have a square or rectangular shape. In such scenarios, the first area is based on the large-area cell 122 having a first edge length between 15 microns and 50 microns. Additionally, the second area could be based on the small-area cell 124 having a second edge length between 2 microns and 15 microns. In other embodiments, the photodetector cells 120 could have a round shape, a hexagonal shape, or another type of shape. As an example, in the case of circular photodetector cells, the large-area cell 122 could have a first area based on a first diameter between 15 microns and 50 microns. Furthermore, the small-area cell 124 could have a second area based on a second diameter between 2 microns and 15 microns.

In some examples, the plurality of photodetector cells 120 could be configured to be illuminated by incident light 10 that passes through a backside surface 114 of the substrate 110. In other examples, the plurality of photodetector cells 120 could be illuminated by the incident light 10 via a frontside surface.

In various embodiments, at least some of the plurality of photodetector cells 120 could be optically coupled to respective microlenses 128. As an example, the microlens 128 could include a hemispherical lens that may be coupled directly to the surface of the respective photodetector cell. As an example, the microlens 128 could include a spherical convex surface configured to refract incident light 10 so as to focus the light onto the respective photodetector cell. Additionally or alternatively, a microlens 128 could be optically coupled to multiple photodetector cells. In such a scenario, the microlens 128 could be configured to spread the incident light 10 evenly over the relevant plurality of photodetector cells 120. Other ways to utilize one or more microlenses 128 with the plurality of photodetector cells 120 are contemplated and possible.

In some embodiments, the microlenses 128 could have a side length and/or diameter less than one millimeter (e.g., 5-50 microns). The microlenses 128 could include spherical and/or aspherical optical elements. In some embodiments, the microlenses 128 could include a gradient-index (GRIN) lens. Yet further, the microlenses 128 could include Fresnel-type lenses (e.g., binary optical lenses), which may utilize optical diffraction. In some embodiments, the microlenses 128 could be arranged such that each microlens corresponds to an independent photodetector cell. Accordingly, the microlenses 128 could be disposed according to the layouts described in reference to FIGS. 2B, 2C, 2D, 2E, and 2F. In other embodiments, a single microlens could be optically coupled to several photodetector cells.

In some examples, the microlenses 128 could be formed from plastic, glass, polycarbonate, or other optical materials. In various examples, the microlenses 128 could be formed on the photodetector cells 120 by way of photolithography, etching, and/or selective deposition techniques.

In some embodiments, each photodetector cell of the plurality of photodetector cells 120 could include a single-photon avalanche diode (SPAD) 126. In such scenarios, each SPAD 126 could be operated in a Geiger mode of operation. In such a fashion, an array of photodetector cells 120 could provide an output signal that is substantially linear in proportion to the number of photons incident on the photodetectors cells 120 over a given period of time (e.g., photon flux). However, other types of photodetector cells and modes of operation are contemplated and possible.

In some examples, the plurality of photodetector cells 120 could be electrically coupled in a parallel arrangement. However, other ways to electrically couple the plurality of photodetector cells 120 are contemplated and possible.

The device 100 also includes read out circuitry 130 coupled to the plurality of photodetector cells 120. The read out circuitry 130 is configured to provide an output signal 132 based on incident light 10 detected by the plurality of photodetector cells 120.

In various embodiments, the read out circuitry 130 includes a respective quenching circuit 134 for each SPAD 126. In some embodiments, the respective quenching circuits 134 could include a passive or active quenching circuit. For example, a passive quenching circuit could include a quenching resistor 135 coupled in series with the SPAD 126. Additionally or alternatively, an active quenching circuit could include a fast discriminator circuit or a synchronous bias voltage reduction circuit.

Additionally or alternatively, the read out circuitry 130 could include one or more amplifiers 136. For example, at least one first amplifier 136a could be coupled to the large-area cell 122 and at least one second amplifier 136b could be coupled to the small-area cell 124. In some embodiments, the amplifiers 136 could include single- or multiple-channel low noise amplifiers. However, other types of readout amplifiers (e.g., CMOS inverter amplifier, cascode operational amplifier, and/or transimpedance amplifier, etc.) are also considered and possible.

Furthermore, the read out circuitry 130 may include one or more analog to digital converter (ADC) devices 138. As an example, at least one first 12-bit analog to digital converter (ADC) 138a could be coupled to the large-area cell 122. Also, at least one second 12-bit ADC 138b could be coupled to the small-area cell 124. In such scenarios, the read out circuitry 130 could be configured to compand (e.g., with compander 139) or otherwise combine an output of the first 12-bit ADC 138a and an output of the second 12-bit ADC 138b to form the output signal 132. For example, the output signal 132 could include a 16-bit representation of the light received by the photodetector. In other words, the output signal 132 could include a higher bit resolution representation of the light received by the photodetector than if photodetectors having a same area were utilized. In such a fashion, devices and systems contemplated herein could provide higher dynamic range output, allowing more reliable operation under a wider variety of background light conditions.

In some examples, a combination of the plurality of photodetector cells 120 and the read out circuitry 130 may define a solid-state, multi-element, single photon detector, such as a silicon photomultiplier (SiPM). It will be understood that while the present disclosure describes the use of SPADs and SiPMs, other types of photodetectors are possible and contemplated. For example, other photodetectors designed to operate in Geiger mode are possible and contemplated. Furthermore, while SiPMs as described herein may relate to silicon-based devices, it will be understood that photodetectors utilizing other materials are possible and contemplated. For example, the various light-detecting elements described herein could be formed using other semiconductor materials such as germanium or compound semiconductor materials such as GaAs/AlGaAs, InGaAs/InP, or InGaAsP/InP. Other photodetector materials are contemplated.

In some embodiments, the SPADs 126 could include semiconductor devices that include a p-n junction that is designed to operate when reverse-biased at a voltage $V_a$ greater than a breakdown voltage $V_B$ of the junction. For example, $V_a$ could be applied across the p-n junction, which could be approximately 1-5 microns thick, so as to provide an electric field greater than $3 \times 10^5$ V/cm. Other electric fields and breakdown voltages are possible and contemplated.

In some embodiments, the photodetector cells 120 could be configured to detect infrared light (e.g., 905 nm or 1550 nm). However, other wavelengths of light could be detected as well. The photodetector cells 120 could be configured and/or biased so as to provide a milliampere or more of photocurrent in response to absorbing a single photon. Other configurations and/or photocurrents are possible and contemplated.

For example, each SiPM 140 could include at least 1000 photodetector cells 120. It will be understood that more or less SPADs 126 could be associated with each SiPM 140. In some embodiments, a plurality of SiPMs 140 could be arranged along the substrate 110 with a density of about 0.4 SiPMs per $mm^2$.

Figure 2A:
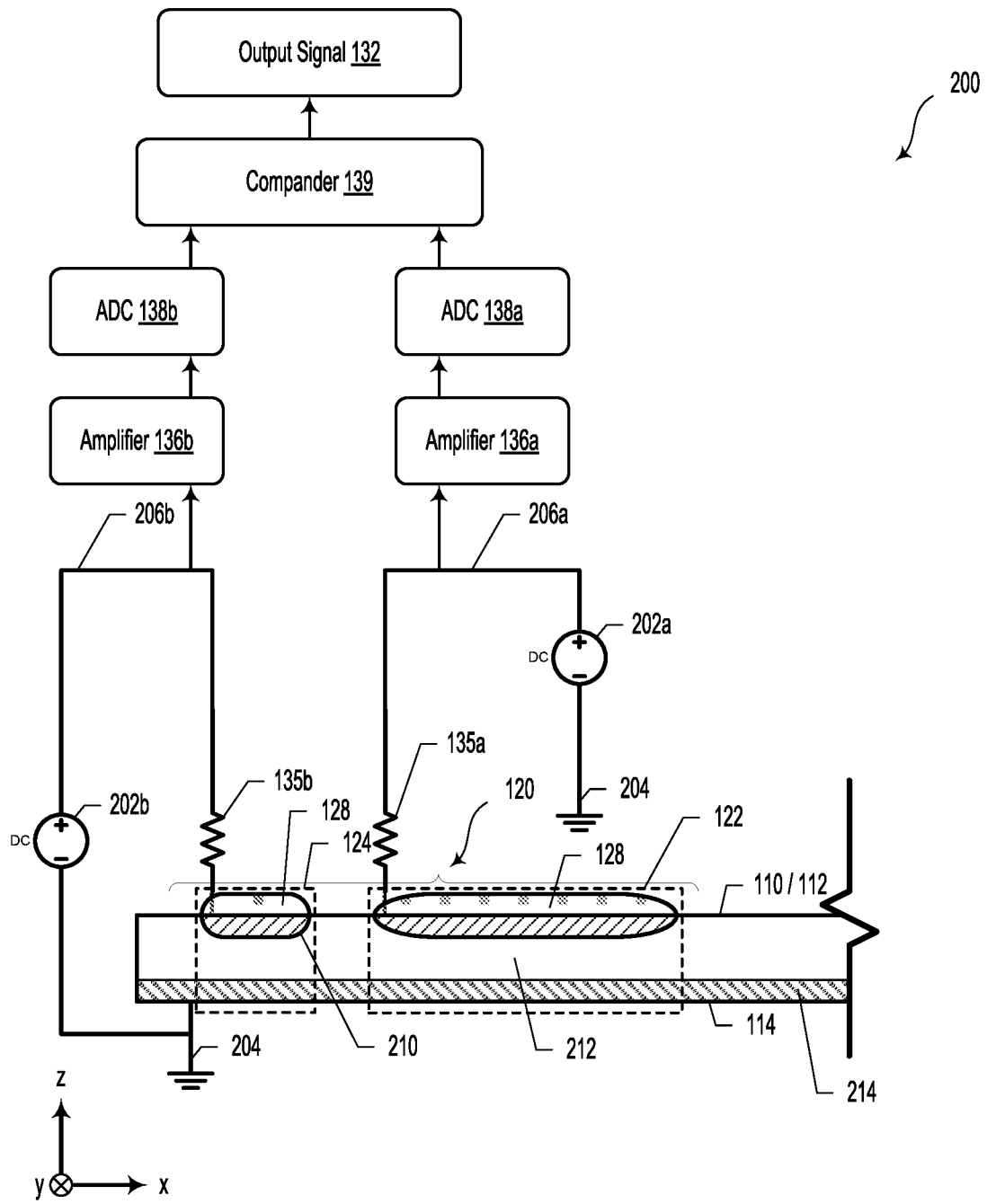
FIG. 2A illustrates a device cross-section, according to an example embodiment.

FIG. 2A illustrates a cross-section of a device 200, according to an example embodiment. In some embodiments, device 200 could be similar or identical to device 100, as illustrated and described in references in FIG. 1. Device 200 could include a plurality of photodetector cells 120. For example, device 200 may include a large-area cell 122 and a small-area cell 124. In some embodiments, the photodetector cells 120 could each include a respective p-doped region 210, an avalanche region 212, and an n-doped body region 214. As shown, the p-doped region 210 of each photodetector 120 may be arranged along a primary plane 112 corresponding to a frontside surface of the substrate 110, and the n-doped body region 214 may be arranged along a backside surface 114 of the substrate 110.

In some embodiments, the large-area cell 122 and the small-area cell 124 could be optically coupled to respective microlenses 128. As described elsewhere herein, the microlenses 128 could include hemispherical convex lenses. However, other types of microlenses (e.g., diffractive optical microlenses) are possible and contemplated.

In some embodiments, the large-area cell 122 and the small-area cell 124 could be electrically coupled to a quenching resistor 135a and 135b, respectively. In some embodiments, device 200 could include voltage bias sources 202a and 202b, which could include a constant voltage and/or constant current bias circuit (e.g., voltage/current divider or equivalent) with respect to a ground node 204. In such scenarios, voltage bias source 202a could provide a constant voltage to large-area cell 122 and its quenching resistor 135a. Additionally or alternatively, voltage bias source 202b could provide a constant voltage to small-area cell 122 and its quenching resistor 135b. In some examples, device 200 could include a large-area cell output node 206a and a small-area cell output node 206b. Such nodes 206a and 206b could be nodes by which the output signal 132 is obtained or determined.

As illustrated in FIG. 2A, device 200 may include respective amplifiers 136a and 136b that may be coupled to the large-area cell 122 and the small-area cell 124, respectively. The analog output of the amplifiers 136a and 136b may be converted to a digital signal with respective ADCs 138a and 138b. In some embodiments, ADCs 138a and 138b could be configured to provide 12-bit resolution.

Yet further, device 200 may include a compander 139 or another type of signal processing hardware configured to accept digital signal inputs and expand them to provide a higher-dynamic range signal. In such a manner, the output signal 132 could include a 16-bit (or higher resolution)

digital signal that is indicative of a photon flux on the plurality of photodetector cells during a given period of time.

FIGS. 2B, 2C, 2D, 2E, and 2F illustrate device layouts 220, 230, 240, 250, and 260, respectively, according to example embodiments. The various device layouts 220, 230, 240, 250, and 260 could illustrate various spatial layouts of some or all elements of devices 100 or 200, as illustrated and described in reference to FIGS. 1 and 2A, respectively.

Figure 2B:
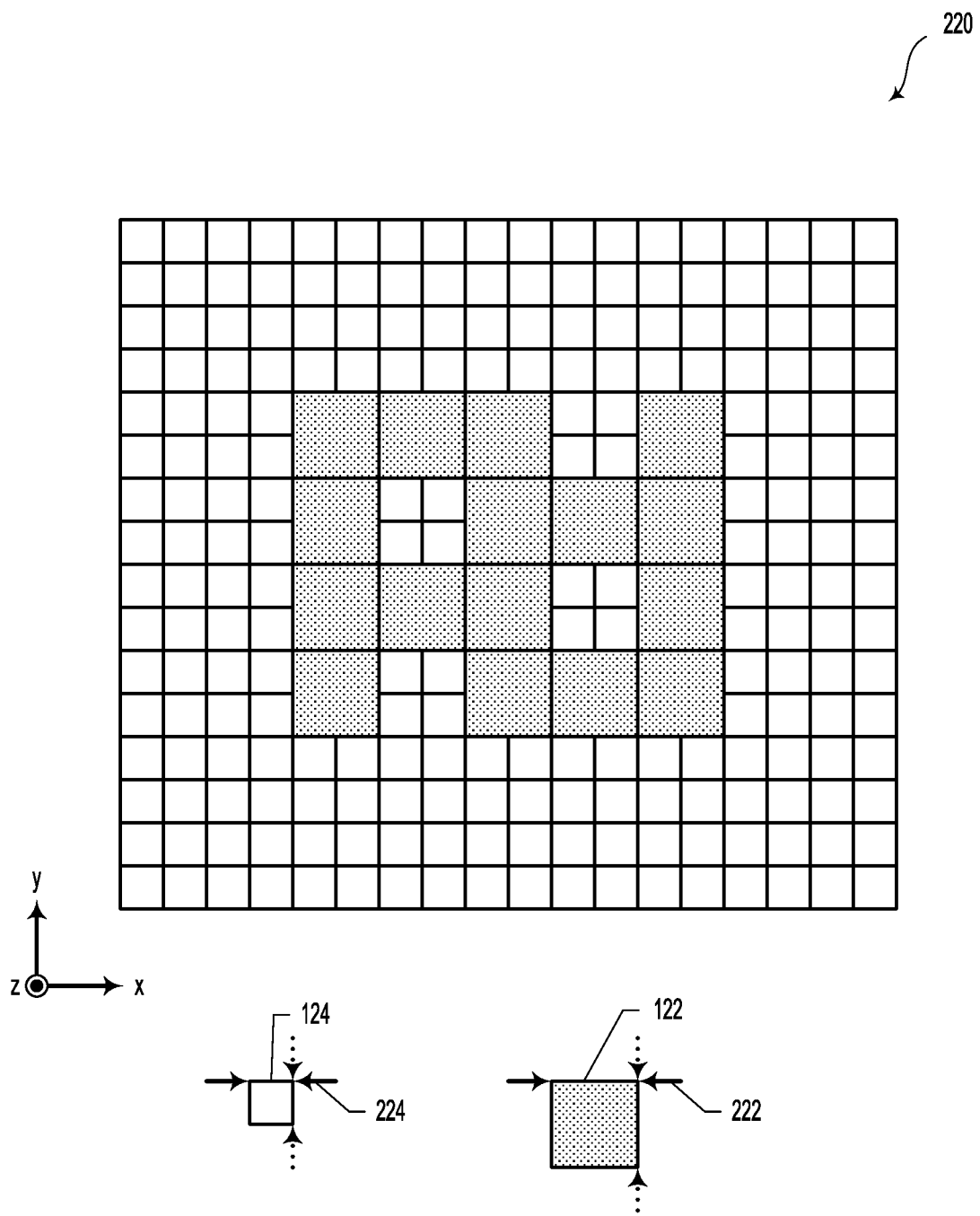
FIG. 2B illustrates a device layout, according to an example embodiment.

The device layout 220 shown in FIG. 2B could illustrate a possible layout for a plurality of photodetector cells 120 as contemplated herein. For example, large-area cells 122 could be disposed so as to be localized near a central portion of the overall layout 220, with some small-area cells 124 interspersed within the central portion as well.

As described herein, the large-area cell 122 may have a first edge length 222 that could range between 15 microns and 50 microns. Additionally or alternatively, the small-area cell 124 could have a second edge length 224 between 2 microns and 15 microns. It will be understood that other edge lengths (as well as other dimensions of the large-area and small-area cells) are possible and contemplated.

Figure 2C:
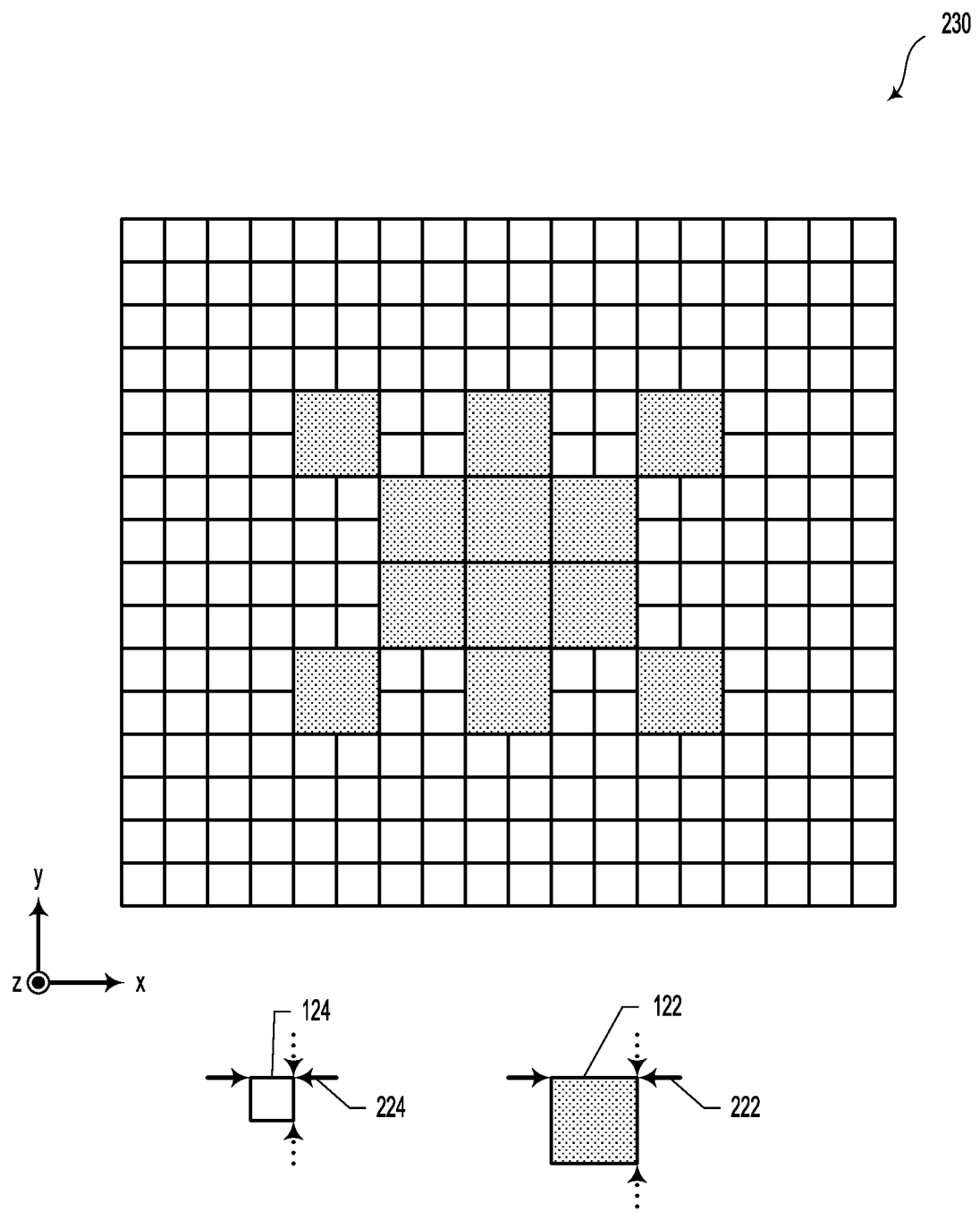
FIG. 2C illustrates a device layout, according to an example embodiment.

FIG. 2C illustrates an alternative device layout 230, according to an example embodiment. Device layout 230 could include a grouping of large-area cells 122 near a central portion of the overall layout 230, with small-area cells 124 disposed at the outer portions of the layout 230.

Figure 2D:
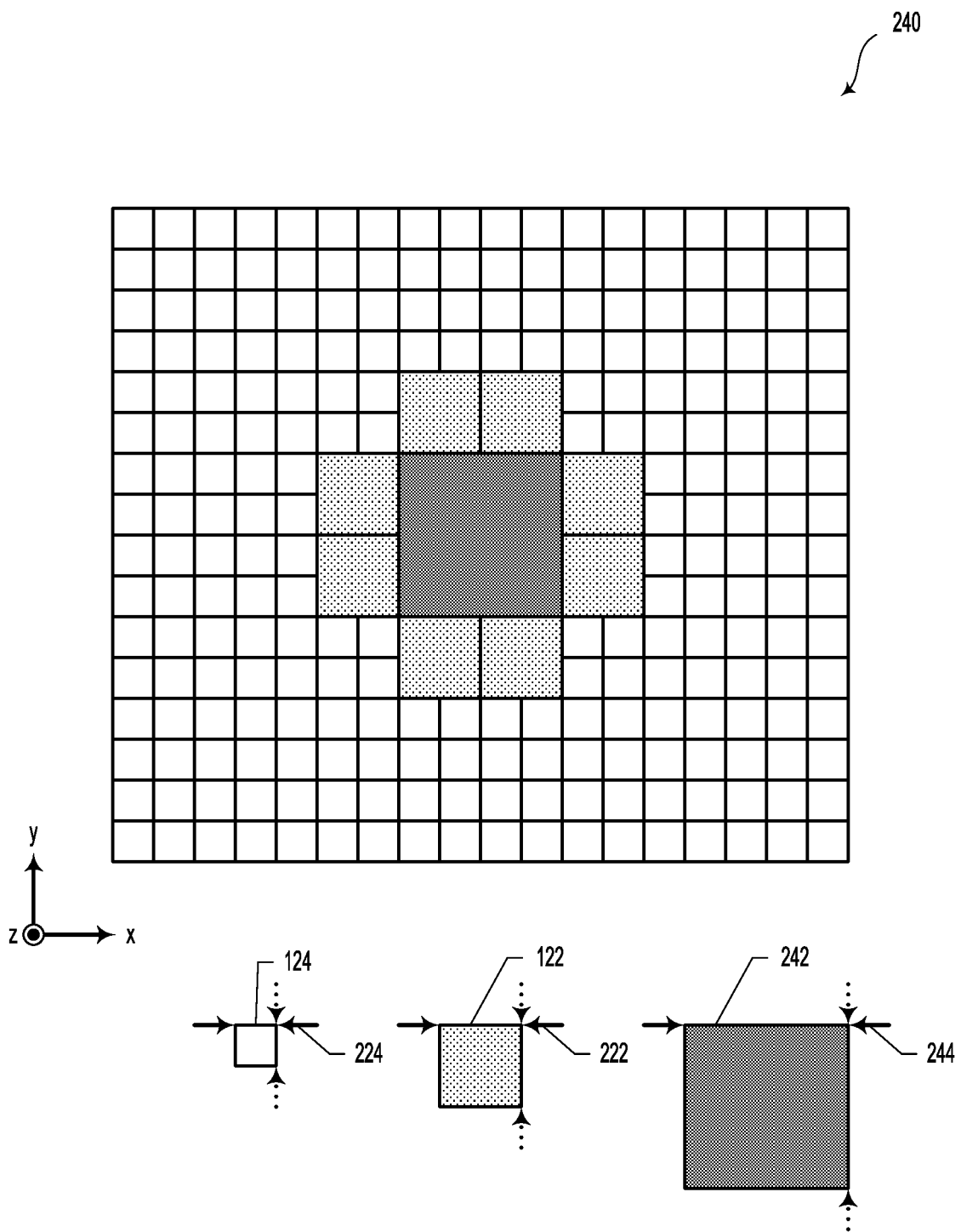
FIG. 2D illustrates a device layout, according to an example embodiment.

FIG. 2D illustrates an alternative device layout 240, according to an example embodiment. Although large-area cells 122 and small-area cells 124 are contemplated herein, it will be understood that cells having other areas are possible as well. For example, device layout 240 could include an extra-large-area cell 242, which could have an edge length 244 of greater than 50 microns. Additionally or alternatively, extra-small-area cells (not shown) with edge lengths less than 2 microns are also possible and contemplated.

Figure 2E:
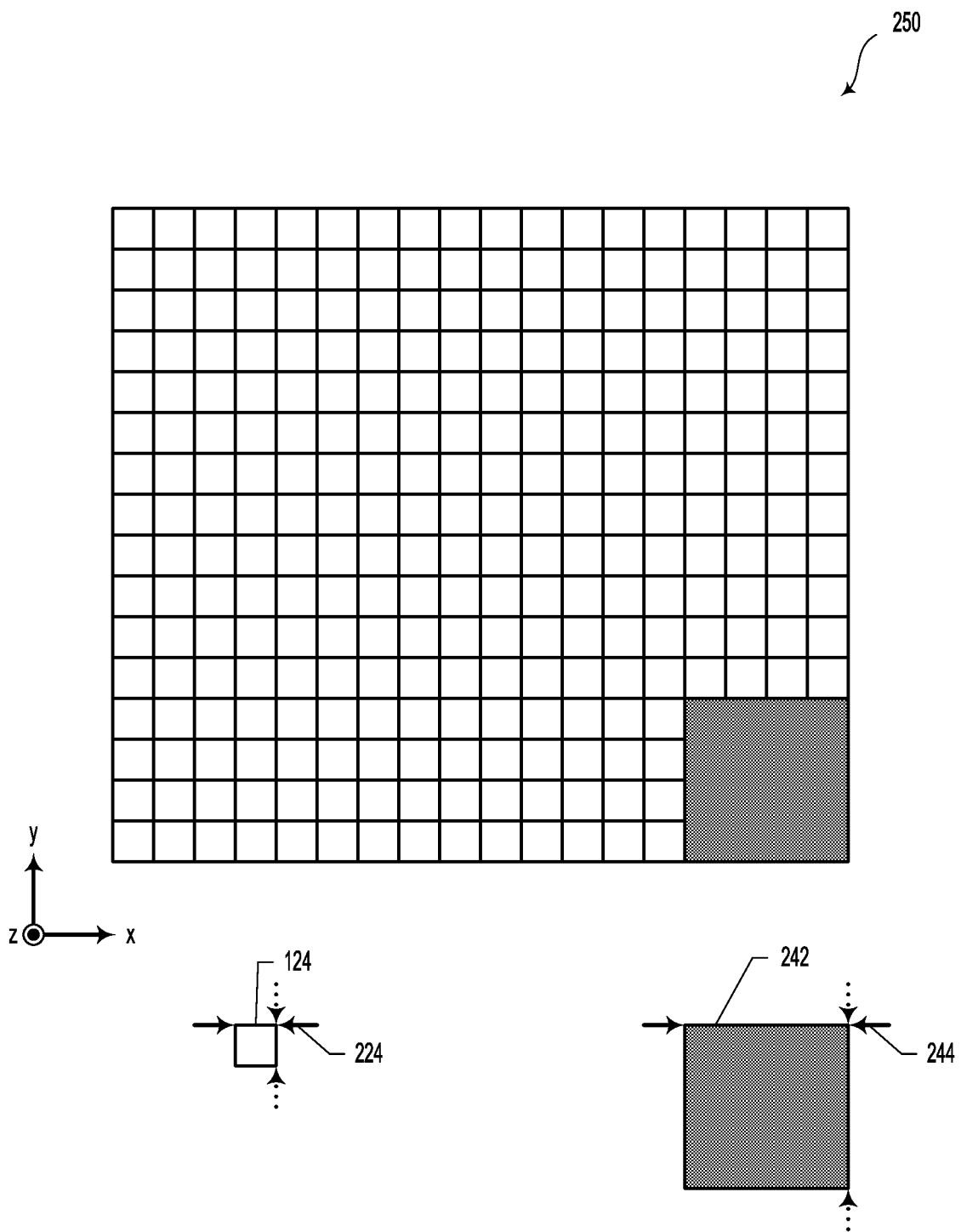
FIG. 2E illustrates a device layout, according to an example embodiment.

FIG. 2E illustrates an alternative device layout 250, according to an example embodiment. Layout 250 could include an extra-large area cell 242 disposed near an edge of the plurality of photodetector cells. In such a scenario, the extra-large area cell 242 could be operated in an avalanche mode (e.g., non-Geiger mode). In such a scenario, the extra-large area cell 242 may be less sensitive to photons as compared to the small-area cells 124 and could be utilized as a detector for very bright light signals that might otherwise saturate the multi-element detector.

Figure 2F:
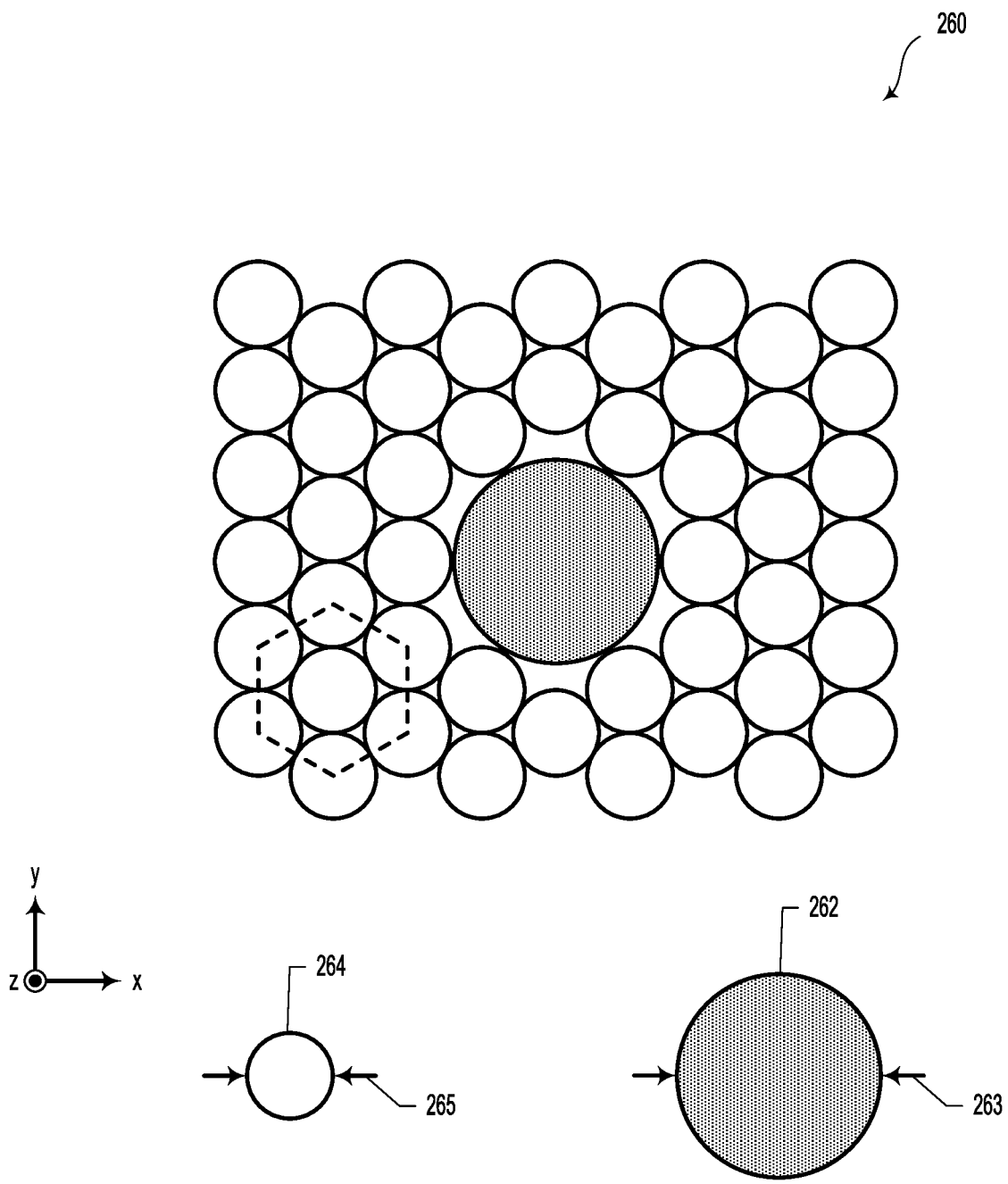
FIG. 2F illustrates a device layout, according to an example embodiment.

FIG. 2F illustrates an alternative device layout 260, according to an example embodiment. Layout 260 could include photodetector cells having a circular shape, although other cell shapes are contemplated and possible. Furthermore, at least a portion of the photodetector cells could include a large-area cell 262 and a small-area cell 264. For example, the large-area cell 262 could have a diameter 263 between 15 microns and 50 microns. Additionally, the small-area cell 264 could have a diameter 265 between 2 microns and 15 microns. It will be understood that other diameters are possible and contemplated.

While FIGS. 2A, 2B, 2C, 2D, 2E, and 2F illustrate various electrical circuits, component arrangements, and layouts, it will be understood that a variety of different electrical configurations, components, and arrangements are possible and contemplated. As described herein, the various layouts may help illustrate how a spatial mix of large- and small-area cells could provide a higher dynamic range with less susceptibility to blooming due to high photon flux backgrounds compared to using large- or small-area cells alone.

In other words, using smaller area cells, which have lower photon detection efficiency (PDE) but higher dynamic range than their larger counterparts, could improve overall device dynamic range. Additionally, using the large-area cells could provide high sensitivity at low photon fluxes. Accordingly, by mixing the different element sizes, a device may be "tuned" based on desired multi-element detector characteristics (e.g., minimum dynamic range, minimum detectable photon flux, etc.).

III. Example Lidar Systems

Figure 3:
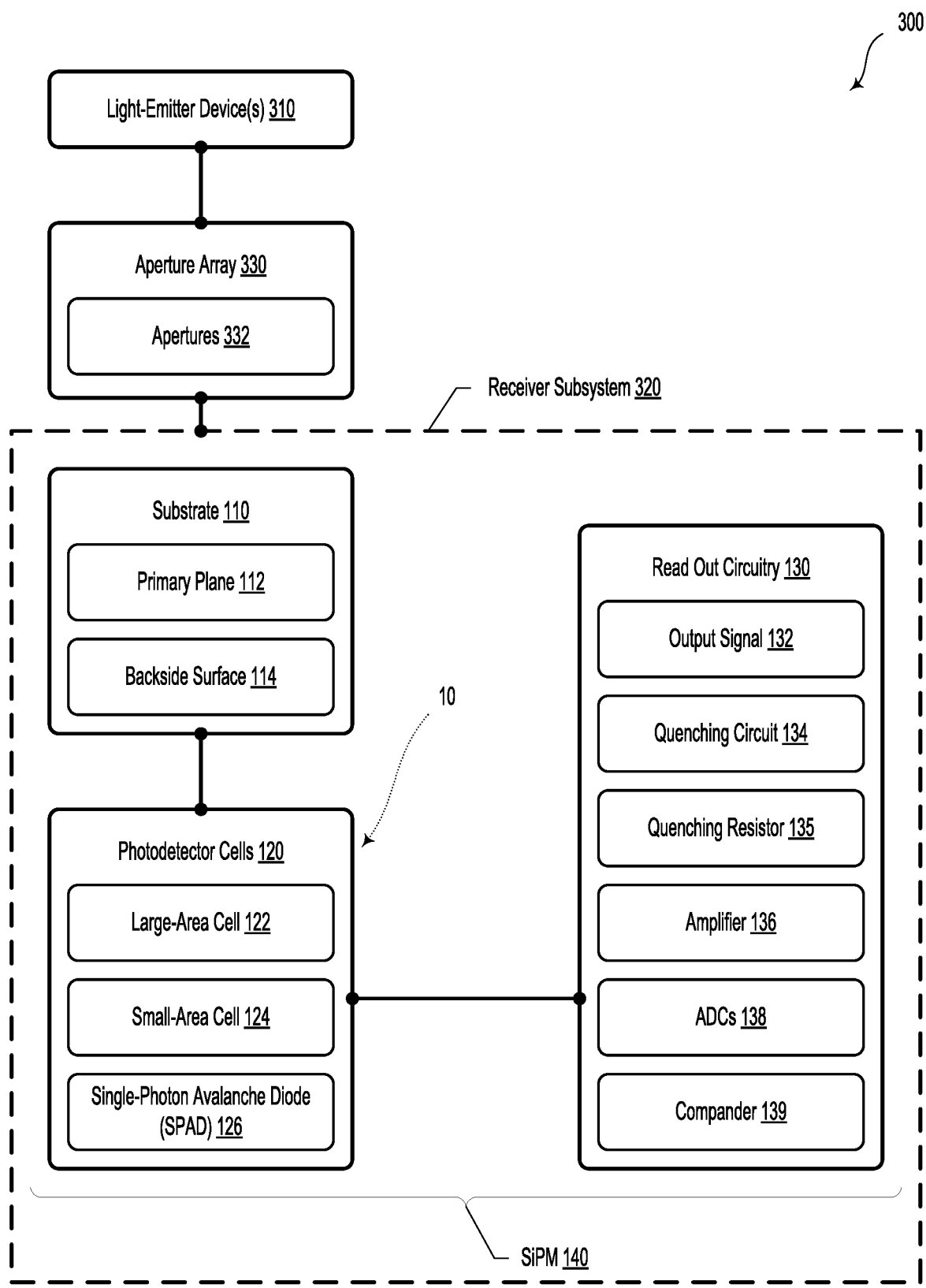
FIG. 3 illustrates a light detection and ranging system, according to an example embodiment.

FIG. 3 illustrates a light detection and ranging (lidar) system 300, according to an example embodiment. In some embodiments, the lidar system 300 may be coupled to a vehicle and used in the operation of the vehicle, such as when the vehicle is in an autonomous or semi-autonomous mode or when the vehicle is a fully autonomous vehicle.

The lidar system 300 includes at least one light-emitter device 310 and a receiver subsystem 320. The receiver subsystem 320 includes a substrate (e.g., substrate 110) defining a primary plane (e.g., primary plane 112).

The receiver subsystem 320 could also include a plurality of multi-element solid-state photodetector devices (e.g., SiPMs 140). In such a scenario, each multi-element photo detector may include a plurality of photodetector cells (e.g., photodetector cells 120) disposed along the primary plane. The plurality of photodetector cells includes at least one large-area cell 122 and at least one small-area cell 124. The large-area cell 122 has a first area and the small-area cell 124 has a second area. The first area is greater than the second area.

Furthermore, the receiver subsystem 320 includes read out circuitry 130 coupled to the plurality of photodetector cells. The read out circuitry 130 is configured to provide an output signal 132 based on incident light 10 detected by the plurality of photodetector cells 120.

In some examples, the lidar system 300 may additionally include an aperture array 330 comprising a plurality of apertures 332. The respective photodetector cells 120 and the aperture array 330 are aligned so as to define a plurality of receiver channels. Each receiver channel includes a respective group of photodetector cells 120 optically coupled to a respective aperture of the plurality of apertures 332.

Yet further, the read out circuitry 130 could include at least one first 12-bit analog to digital converter (ADC) 138a coupled to the large-area cell 122 and at least one second 12-bit ADC 138b coupled to the small-area cell 124. In such scenarios, the read out circuitry 130 could be configured to combine an output of the first 12-bit ADC 138a and an output of the second 12-bit ADC 138b to form the output signal 132. The output signal 132 includes a 16-bit representation of the light received by the photodetector.

Figure 4:
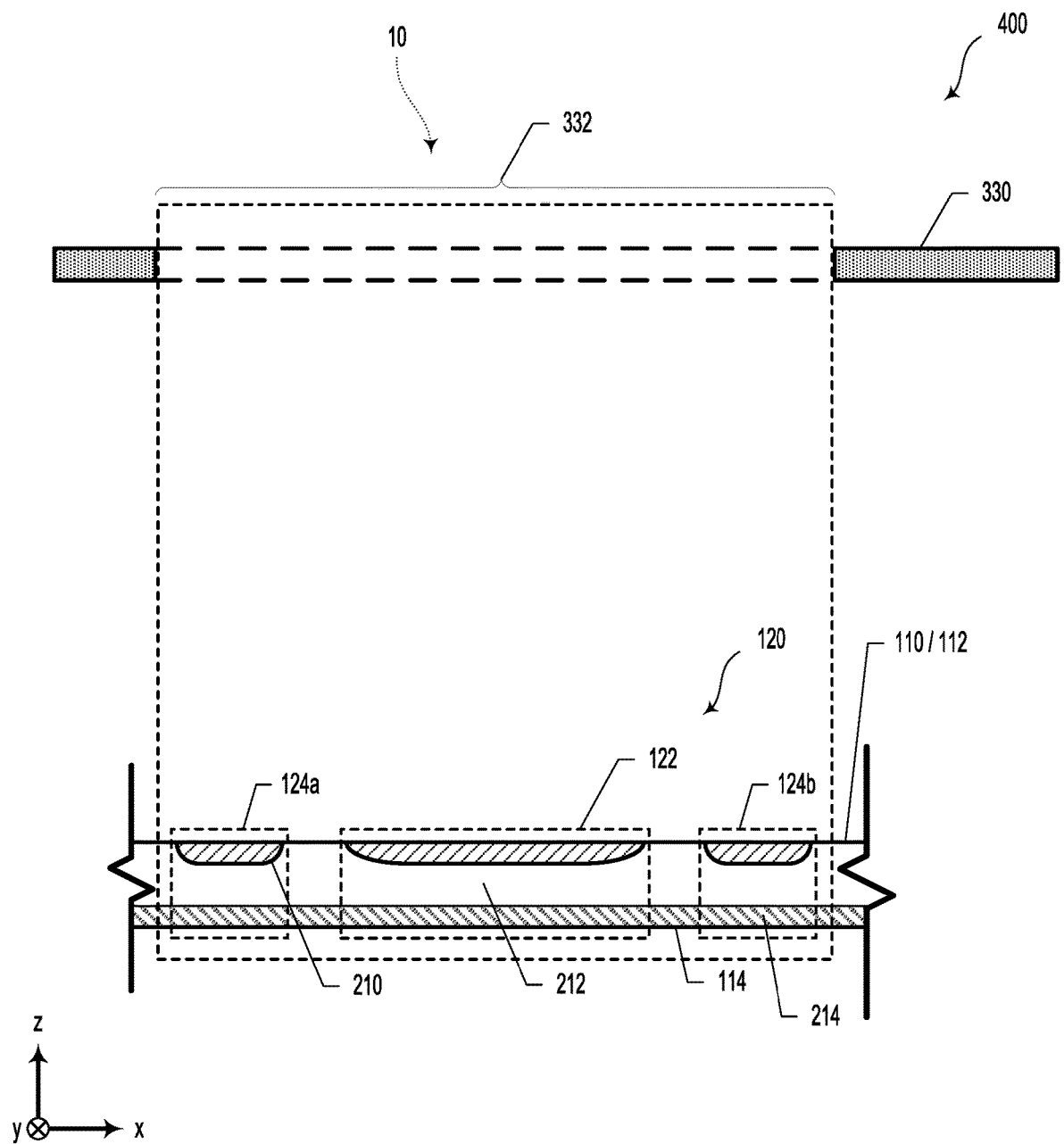
FIG. 4 illustrates a portion of the light detection and ranging system of FIG. 3, according to an example embodiment.
Figure 5A:
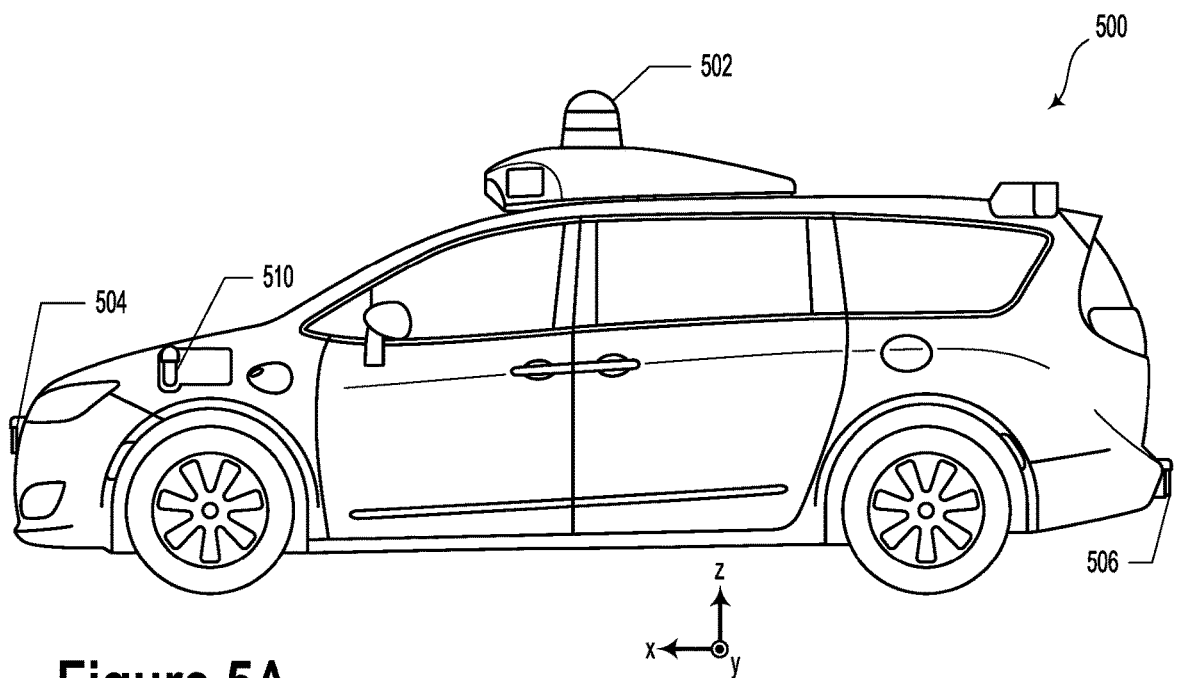
FIG. 5A illustrates a vehicle, according to an example embodiment.
Figure 5B:
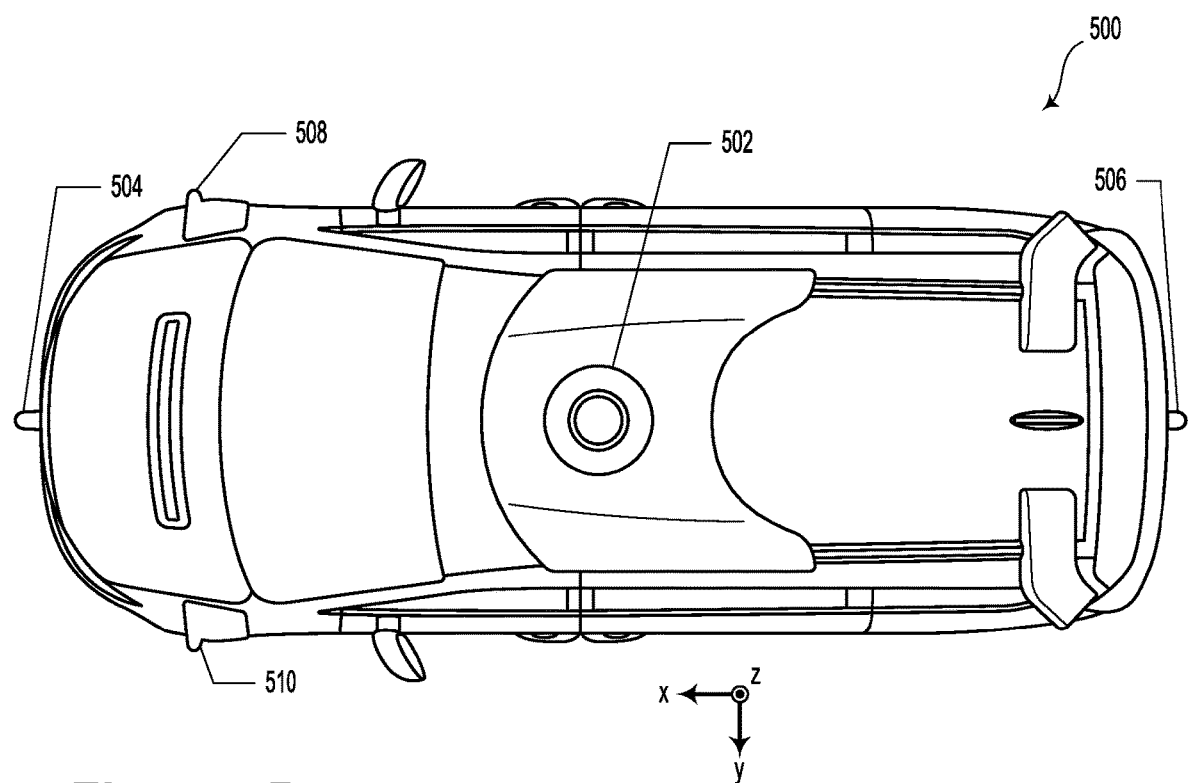
FIG. 5B illustrates a vehicle, according to an example embodiment.
Figure 5C:
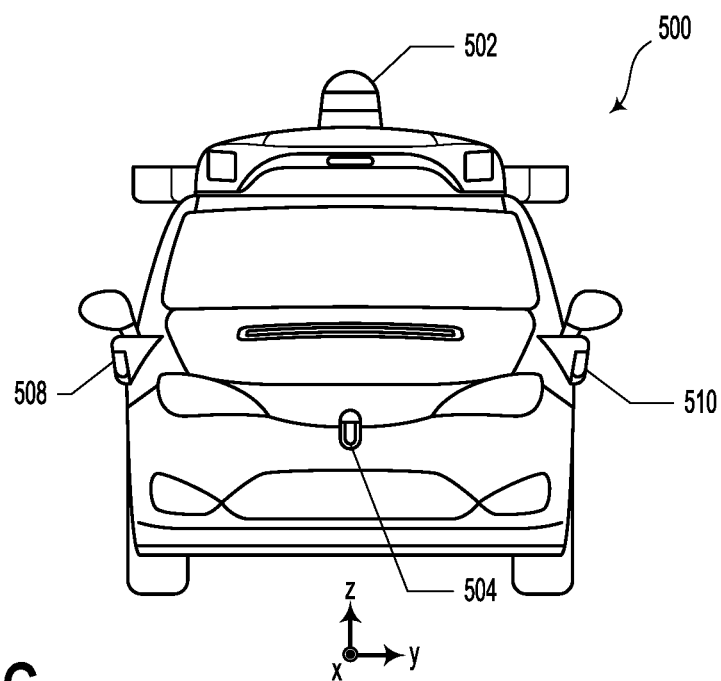
FIG. 5C illustrates a vehicle, according to an example embodiment.
Figure 5D:
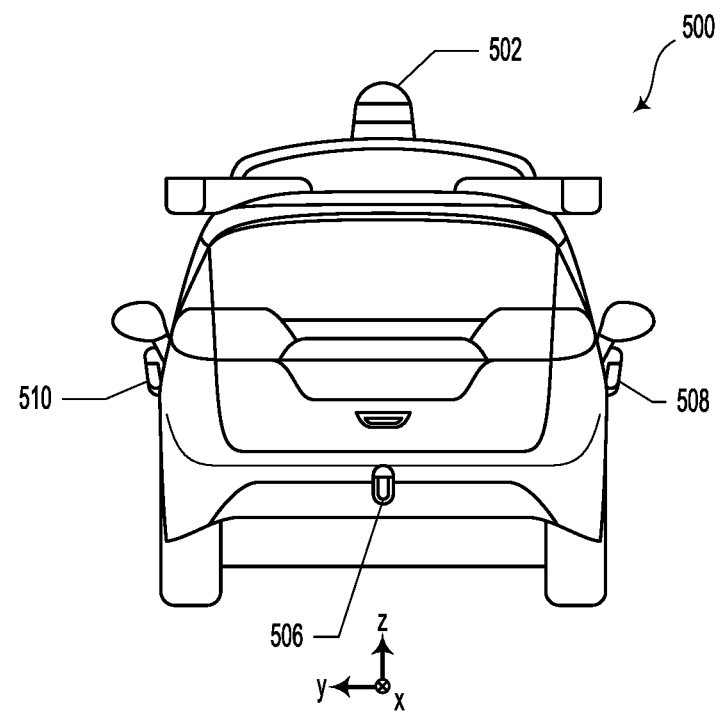
FIG. 5D illustrates a vehicle, according to an example embodiment.
Figure 5E:
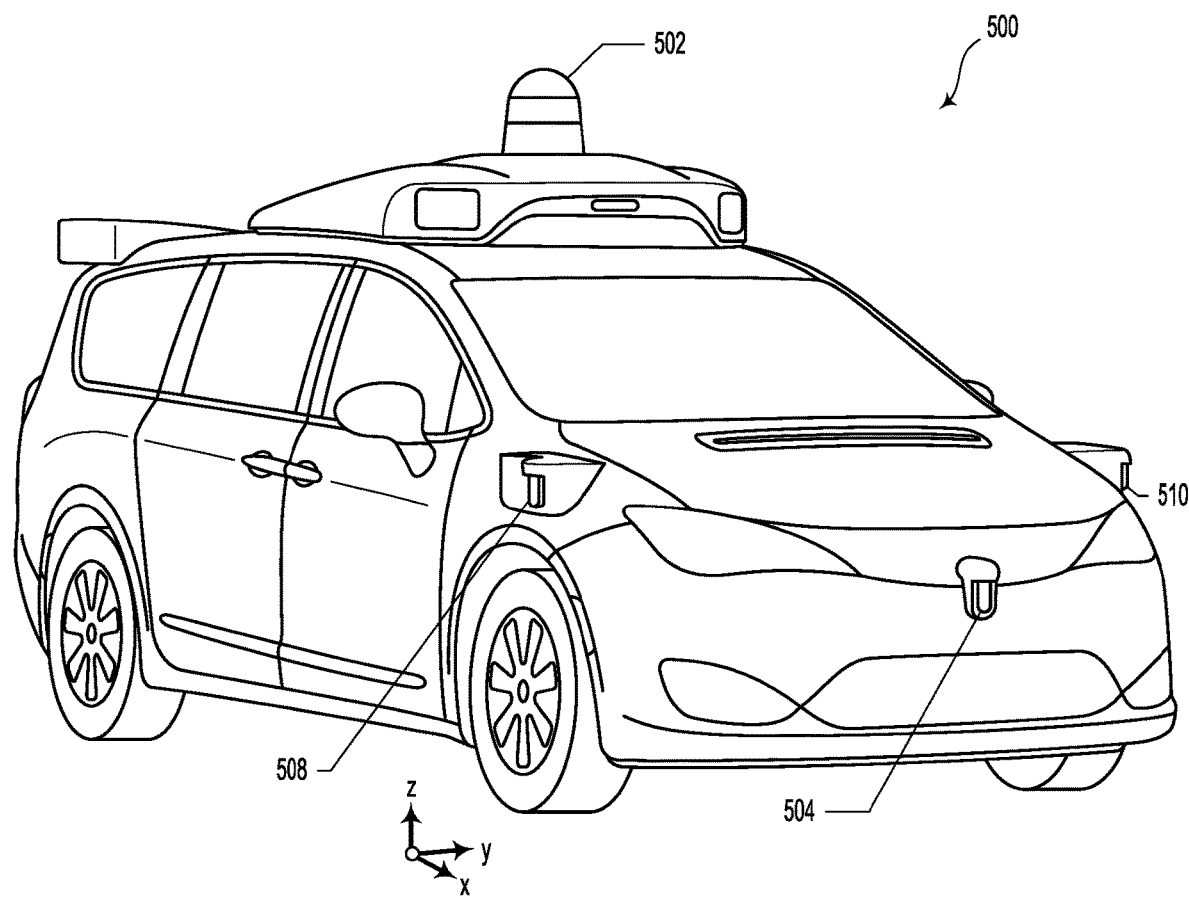
FIG. 5E illustrates a vehicle, according to an example embodiment.

FIG. 4 illustrates a portion 400 of the lidar system 300 of FIG. 3, according to an example embodiment. As illustrated, FIG. 4 includes an aperture array 330 with at least one aperture 332. In some embodiments, the at least one aperture 332 could include a circular opening in the aperture array 330. In some embodiments, the at least one aperture 332 could have a diameter of approximately 200 microns. However, larger and smaller openings are possible and contemplated.

Furthermore, the portion 400 includes a plurality of photodetector cells 120, as illustrated and described in reference to FIGS. 1 and 2. As illustrated, the plurality of photodetector cells 120 includes a large-area cell 122 and two small-area cells 124a and 124b. In some embodiments, the various device layouts 220, 230, 240, 250, and 260, illustrated and described in reference to FIGS. 2B, 2C, 2D, 2E, and 2F could be possible configurations of the plurality of photodetectors 120 of portion 400. It will be understood that the aperture array 330 could include a plurality of apertures 332. Accordingly, the plurality of photodetector cells 120 could include layouts in which one or more large-area cells are substantially centered with respect to a respective optical axis of each aperture. It will be understood that other layouts or configurations could be selected so as to beneficially balance the multi-element photodetector characteristics of dynamic range, background light insensitivity, and low-light sensitivity.

IV. Example Vehicles

FIGS. 5A, 5B, 5C, 5D, and 5E illustrate a vehicle 500, according to an example embodiment. In some embodiments, the vehicle 500 could be a semi- or fully-autonomous vehicle. While FIGS. 5A, 5B, 5C, 5D, and 5E illustrates vehicle 500 as being an automobile (e.g., a passenger van), it will be understood that vehicle 500 could include another type of autonomous vehicle, robot, or drone configured to navigate within its environment using sensors and other information about its environment. Vehicle 500 may be, for example, a car, a truck, a tractor-trailer, a warehouse robot, a delivery robot, or construction equipment such as an autonomous bulldozer.

The vehicle 500 may include one or more sensor systems 502, 504, 506, 508, and 510. In some embodiments, sensor systems 502, 504, 506, 508, and 510 could include devices 100 or 200 and/or device layouts 220, 230, 240, 250, or 260 and/or lidar system 300 as illustrated and described in relation to FIGS. 1, 2A, 2B, 2C, 2D, 2E, and 3, respectively. In other words, the devices, device layouts, and systems described elsewhere herein could be coupled to the vehicle 500 and/or could be utilized in conjunction with various operations of the vehicle 500. As an example, the devices 100 or 200 and/or the lidar system 300 could be utilized in self-driving or other types of navigation, planning, perception, and/or mapping operations of the vehicle 500.

While the one or more sensor systems 502, 504, 506, 508, and 510 are illustrated on certain locations on vehicle 500, it will be understood that more or fewer sensor systems could be utilized with vehicle 500. Furthermore, the locations of such sensor systems could be adjusted, modified, or otherwise changed as compared to the locations of the sensor systems illustrated in FIGS. 5A, 5B, 5C, 5D, and 5E.

In some embodiments, the one or more sensor systems 502, 504, 506, 508, and 510 could include image sensors. Additionally or alternatively the one or more sensor systems 502, 504, 506, 508, and 510 could include lidar sensors. For example, the lidar sensors could include a plurality of light-emitter devices arranged over a range of angles with respect to a given plane (e.g., the x-y plane). For example, one or more of the sensor systems 502, 504, 506, 508, and 510 may be configured to rotate about an axis (e.g., the z-axis) perpendicular to the given plane so as to illuminate an environment around the vehicle 500 with light pulses. Based on detecting various aspects of reflected light pulses (e.g., the elapsed time of flight, polarization, intensity, etc.), information about the environment may be determined.

In an example embodiment, sensor systems 502, 504, 506, 508, and 510 may be configured to provide respective point cloud information that may relate to physical objects within the environment of the vehicle 500. While vehicle 500 and sensor systems 502, 504, 506, 508, and 510 are illustrated as including certain features, it will be understood that other types of sensor systems are contemplated within the scope of the present disclosure.

Lidar systems with one or more light-emitter devices are described and illustrated herein. In some scenarios, lidar systems with multiple light-emitter devices (e.g., a light-emitter device with multiple laser bars on a single laser die) are contemplated. For example, light pulses emitted by one or more laser diodes may be controllably directed about an environment of the system. The angle of emission of the light pulses may be adjusted by a scanning device such as, for instance, a mechanical scanning mirror and/or a rotational motor. For example, the scanning devices could rotate in a reciprocating motion about a given axis (e.g., a horizontal axis) and/or rotate about a vertical axis. In another embodiment, the light-emitter device may emit light pulses towards a spinning prism mirror, which may cause the light pulses to be emitted into the environment based on an angle of the prism mirror angle when interacting with each light pulse. Additionally or alternatively, scanning optics and/or other types of electro-opto-mechanical devices are possible to direct the light pulses toward different locations within the environment.

While FIGS. 5A-5E illustrate various sensors attached to the vehicle 500, it will be understood that the vehicle 500 could incorporate other types of sensors.

As an example embodiment, the vehicle 500 could include at least one light detection and ranging (lidar) system (e.g., lidar system 300). The lidar system could include at least one light-emitter device (e.g., light-emitter device(s) 310) and a receiver subsystem (e.g., receiver subsystem 320).

The receiver subsystem includes a substrate (e.g., substrate 110) defining a primary plane (e.g., primary plane 11) and a plurality of photodetector cells (e.g., photodetector cells 120) disposed along the primary plane. The plurality of photodetector cells includes at least one large-area cell (e.g., large-area cell 122) and at least one small-area cell (e.g., small-area cell 124). The large-area cell has a first area and the small-area cell has a second area and the first area is greater than the second area.

The receiver subsystem also includes read out circuitry (e.g., read out circuitry 130) coupled to the plurality of photodetector cells. The read out circuitry is configured to provide an output signal (e.g., output signal 132) based on incident light detected by the plurality of photodetector cells.

In some embodiments, the read out circuitry could include at least one first 12-bit analog to digital converter (ADC) coupled to the large-area cell and at least one second 12-bit ADC coupled to the small-area cell.

In such scenarios, the read out circuitry could be configured to combine an output of the first 12-bit ADC and an output of the second 12-bit ADC to form the output signal. For example, the output signal could include a 16-bit representation of the light received by the photodetector.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A device comprising:
    a substrate defining a primary plane;
    a plurality of photodetector cells disposed along the primary plane, wherein the plurality of photodetector cells comprises at least one large-area cell and at least one small-area cell, wherein the large-area cell has a first area and the small-area cell has a second area, wherein the first area is greater than the second area; and
    read out circuitry coupled to the plurality of photodetector cells, wherein the read out circuitry is configured to provide an output signal based on incident light detected by the plurality of photodetector cells.

2. The device of claim 1, wherein each photodetector cell of the plurality of photodetector cells comprises a single-photon avalanche diode (SPAD).

3. The device of claim 2, wherein each SPAD is operated in a Geiger mode of operation.

4. The device of claim 2, wherein the read out circuitry comprises a respective quenching circuit for each SPAD, wherein the respective quenching circuit comprises a quenching resistor.

5. The device of claim 1, wherein a combination of the plurality of photodetector cells and the read out circuitry defines at least one solid-state, multi-element, single photon detector.

6. The device of claim 1, wherein a combination of the plurality of photodetector cells and the read out circuitry defines at least one silicon photomultiplier (SiPM).

7. The device of claim 1, wherein the plurality of photodetector cells are electrically coupled in a parallel arrangement.

8. The device of claim 1, wherein the first area is based on a first edge length or first diameter between 15 microns and 50 microns, and wherein the second area is based on a second edge length or second diameter between 2 microns and 15 microns.

9. The device of claim 1, wherein the plurality of photodetector cells is configured to be illuminated by incident light that passes through a backside surface of the substrate.

10. The device of claim 1, wherein the plurality of photodetector cells are disposed according to at least one of a square array or a hexagonal array.

11. The device of claim 1, wherein the read out circuitry comprises:
    at least one amplifier coupled to the large-area cell; and
    at least one amplifier coupled to the small-area cell.

12. The device of claim 1, wherein the read out circuitry comprises:
    at least one analog to digital converter (ADC) coupled to the large-area cell; and
    at least one ADC coupled to the small-area cell, wherein the ADC coupled to the large-area cell is a first 12-bit ADC and the ADC coupled to the large area cell is a second 12-bit ADC, and wherein the read out circuitry is configured to combine an output of the first 12-bit ADC and an output of the second 12-bit ADC to form the output signal, wherein the output signal comprises a 16-bit representation of the light received by the photodetector cells.

13. The device of claim 1, further comprising:
    at least one microlens disposed over a photodetector cell or a group of photodetector cells of the plurality of photodetector cells.

14. The device of claim 1, wherein a position of the at least one large-area cell and the at least one small-area cell is selected based on a predetermined beam intensity profile of the incident light.

15. A light detection and ranging (lidar) system comprising:
    at least one light-emitter device; and
    a receiver subsystem, wherein the receiver subsystem comprises:
        a plurality of photodetector cells, wherein the plurality of photodetector cells comprises at least one large-area cell and at least one small-area cell, wherein the large-area cell has a first area and the small-area cell has a second area, wherein the first area is greater than the second area; and
        read out circuitry coupled to the plurality of photodetector cells, wherein the read out circuitry is configured to provide an output signal based on incident light detected by the plurality of photodetector cells.

16. The lidar system of claim 15 further comprising:
    an aperture array comprising a plurality of apertures, wherein the respective photodetector cells and the aperture array are aligned so as to define a plurality of receiver channels, wherein each receiver channel comprises a respective group of photodetector cells optically coupled to a respective aperture of the plurality of apertures.

17. The lidar of claim 15, wherein the read out circuitry comprises:
    at least one analog to digital converter (ADC) coupled to the large-area cell; and
    at least one ADC coupled to the small-area cell, wherein the ADC coupled to the large-area cell is a first 12-bit ADC and the ADC coupled to the small-area cell is a second 12-bit ADC, and wherein the read out circuitry is configured to combine an output of the first 12-bit ADC and an output of the second 12-bit ADC to form the output signal, wherein the output signal comprises a 16-bit representation of the light received by the photodetector.

18. A vehicle, comprising:
at least one light detection and ranging (lidar) system comprising:
at least one light-emitter device; and
a receiver subsystem, wherein the receiver subsystem comprises:
a plurality of photodetector cells, wherein the plurality of photodetector cells comprises at least one large-area cell and at least one small-area cell, wherein the large-area cell has a first area and the small-area cell has a second area, wherein the first area is greater than the second area; and
read out circuitry coupled to the plurality of photodetector cells, wherein the read out circuitry is configured to provide an output signal based on incident light detected by the plurality of photodetector cells.

19. The vehicle of claim 18, wherein the read out circuitry comprises:
at least one first 12-bit analog to digital converter (ADC) coupled to the large-area cell; and
at least one second 12-bit ADC coupled to the small-area cell.

20. The vehicle of claim 19, wherein the read out circuitry is configured to combine an output of the first 12-bit ADC and an output of the second 12-bit ADC to form the output signal, wherein the output signal comprises a 16-bit representation of the light received by the photodetector.

* * * * *